United States Patent [19]
Bailey

[11] Patent Number: 5,229,914
[45] Date of Patent: Jul. 20, 1993

[54] COOLING DEVICE THAT CREATES LONGITUDINAL VORTICES

[75] Inventor: Douglas A. Bailey, Concord, Mass.

[73] Assignee: Digital Equipment Corporation, Maynard, Mass.

[21] Appl. No.: 887,447

[22] Filed: May 21, 1992

[51] Int. Cl.$^5$ .............................................. H05K 7/20
[52] U.S. Cl. .................................. 361/383; 165/80.3; 165/185; 165/181; 361/386; 257/712
[58] Field of Search ................ 165/80.3, 181, 185; 174/16.3; 357/81; 361/383–384, 386–389; 363/141

[56] References Cited

U.S. PATENT DOCUMENTS

| | | | |
|---|---|---|---|
| 2,107,031 | 2/1938 | Evans | 174/16.3 |
| 3,372,307 | 3/1968 | Bedocs | 361/388 |
| 3,670,215 | 6/1972 | Wilkens et al. | 357/81 |
| 4,222,090 | 9/1980 | Jaffe | 361/386 |
| 4,369,838 | 1/1983 | Asanuma et al. | 361/386 |
| 4,611,238 | 9/1986 | Lewis et al. | 174/16.3 |
| 4,660,123 | 4/1987 | Hermann | 361/386 |
| 4,716,496 | 12/1987 | Bright et al. | 361/386 |

FOREIGN PATENT DOCUMENTS 0144998 6/1990 Japan .................................. 361/384

OTHER PUBLICATIONS

Antonetti et al., IBM Tech. Disclosure Bulletin, "Thermal Coupler", vol. 21, No. 2, Jul. 1978, pp. 749–750.
Lehmann & Huang, 171 *Heat Transfer in Electronic Equipment*, 11 (ASME 1991).

*Primary Examiner*—Gregory D. Thompson
*Attorney, Agent, or Firm*—Cesari and McKenna

[57] ABSTRACT

A cooling device that achieves longitudinal vortex formation, thereby reducing downstream wake, without significantly increased pressure. The device also conducts heat from the electronic component to be cooled, and includes at least one heat-conductive plate having a plurality of evenly distributed pairs of vanes that depend from the edge of the plate and flare in alternating, transverse directions. A post depends from the bottom-most plate (if the device contains more than one) and mounts directly to the component to be cooled.

7 Claims, 1 Drawing Sheet

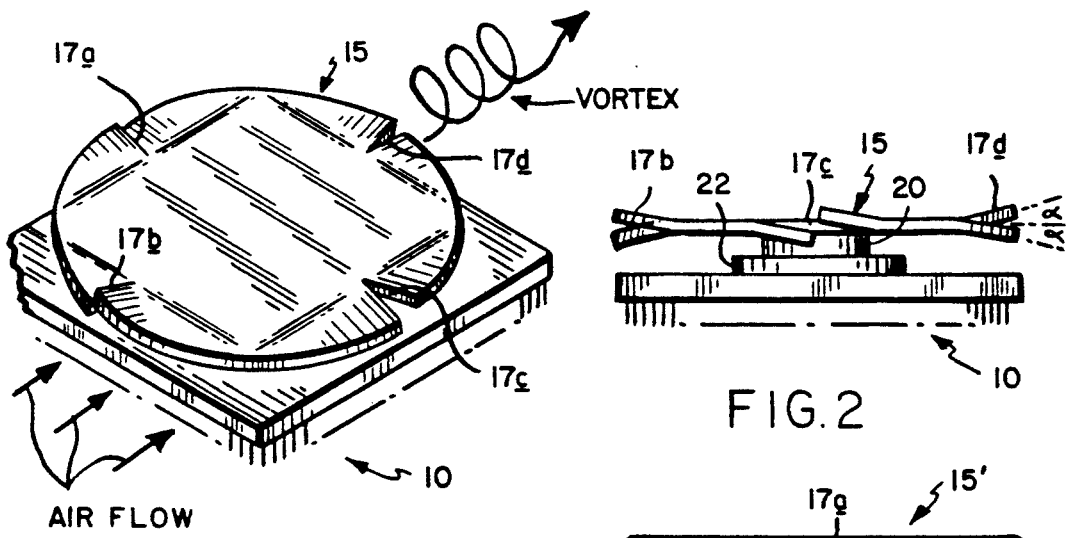
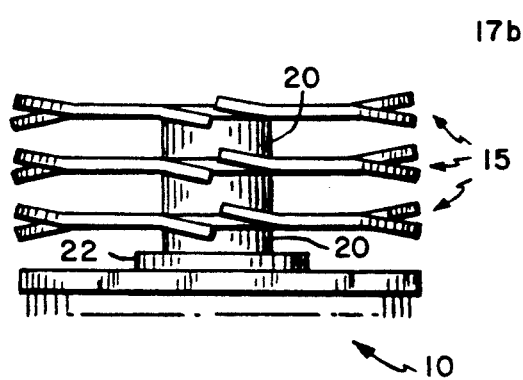 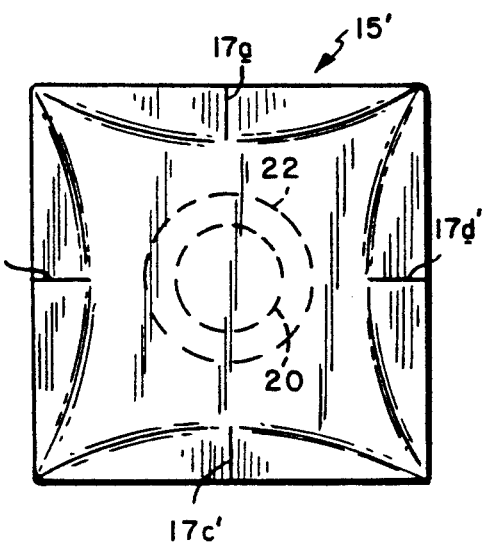
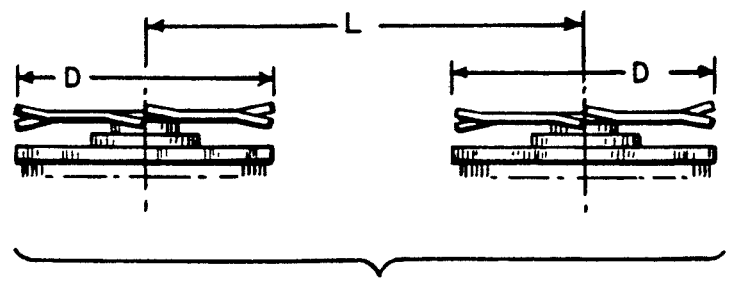

COOLING DEVICE THAT CREATES LONGITUDINAL VORTICES

BACKGROUND OF THE INVENTION

1. Field of the Invention

The present invention relates to direct-air cooling of board-mounted electronic components, and more particularly to an improved cooling device that can be mounted to individual electronic components to enhance the rate of heat transfer therefrom.

2. Description of the Related Art

As the power requirements of electronic components have increased, so has the need for efficient and reliable cooling. Failure adequately to conduct heat from power transistors and other highly dissipative components can result in destruction not only of the components themselves, but also of surrounding components as a consequence of heat buildup.

Manufacturers of apparatus that contain circuit boards typically employ two strategies to conduct heat away from vulnerable electronic parts. First, components that tend to generate the most heat are individually fitted with sinks that conduct heat away from the components. A heat sink, which as used herein refers generally to any device that conducts heat away from electronic components, usually contains a plurality of cooling fins that provide a large surface area (relative to the component to which it is attached). When introduced into an airflow, the fins promote convection of the heat away from the component. Thus, the second heat-reduction strategy involves directing a flow of air (ordinarily by means of an electric fan) at the components and providing ventilation ports through which the warmed air can exit.

Because the rate of heat transfer depends on, among other factors, the area of the heat sink and the velocity of the airflow, it might initially appear possible to maximize the efficiency of heat transfer simply by utilizing the largest heat sinks and air sources available. This approach is untenable from a purely practical perspective, since packaging considerations often severely restrict the space among components and between circuit boards (thereby limiting the allowable "footprint"—i.e., the horizontal space requirement —and height of a heat sink), and even modest improvements in airflow velocity tend to require considerable increases in power consumption.

Even without such constraints, large heat sinks can actually prove counterproductive in an environment crowded with electronic components. Assuming that air issues from a single source, any heat sink will block the flow and create downstream regions of thermal and velocity wake. Air in the wake moves slowly and randomly, retarding efficient convection. Although the wake has little effect on the transfer of heat from the wake-producing heat sink, it can significantly degrade the performance of downstream heat sinks disposed in the wake, since air in the wake is hotter and moves more slowly than the unimpeded airflow. The amount of wake created by a given heat sink depends on its profile. Accordingly, large heat sinks affect downstream components most severely, and it can prove difficult to design heat sinks that facilitate sufficient convection from one component without unacceptable effects on other components.

One proposed solution to this limiting tradeoff is a delta-wing design that produces longitudinal vortices in the direction of the airflow; see Lehmann & Huang, 171 *Heat Transfer in Electronic Equipment* 11 (ASME 1991). A longitudinal vortex will disrupt downstream wake, mixing the hot, slowly moving air in the center of the wake with cooler, high-velocity air outside the wake. This results in improved cooling of downstream components.

Unfortunately, the delta-wing design has drawbacks. It is mounted to the side of the component to be cooled, increasing the effective footprint. The device must also be placed directly in the path of the airflow. These orientation constraints impose design overhead on board architecture, since the layout must accommodate the vortex generators. Moreover, the delta-wing devices merely augment the performance of an existing heat sink by altering the airflow. They do not conduct heat away from electronic components. And finally, the relatively large profile of the delta-wing devices necessarily reduces the effective velocity of the airflow; although the worst effects of wake may be ameliorated, a reduction in velocity will nonetheless diminish the overall cooling rate otherwise obtainable with a given air source.

DESCRIPTION OF THE INVENTION

Brief Summary of the Invention

The present invention is a cooling device that achieves longitudinal vortex formation while also conducting heat from the electronic component to be cooled—i.e., acting as a heat sink. The design does not increase the footprint of the component, nor does it reduce airflow pressure more than conventional heat sinks. Furthermore, the device of the present invention is omnidirectional, i.e., its orientation with respect to an airflow is not critical.

The invention includes at least one heat-conductive plate having a plurality of evenly distributed pairs of vanes that depend from the edge of the plate and flare in alternating, transverse directions. A post depends from the bottom-most plate (if the device contains more than one) and mounts directly to the component to be cooled. The shape of the plate is not critical (although, as discussed below, a round shape offers greatest flexibility), and the footprint of the plate preferably matches that of the component to be cooled.

BRIEF DESCRIPTION OF THE DRAWINGS

The foregoing discussion will be understood more readily from the following detailed description of the invention, when taken in conjunction with the accompanying drawings, in which:

FIG. 1 is an isometric view of a round, single-plate embodiment of the present invention, mounted on a representative electronic component;

FIG. 2 is an elevational view of the embodiment illustrated in FIG. 1;

FIG. 3 is an elevational view of a round, multiple-plate embodiment of the present invention, mounted on a representative electronic component;

FIG. 4 is a plan view of a square-plate embodiment of the present invention; and FIG. 5 is an elevational view of a pair of the embodiments depicted in FIGS. 1 and 2, marked to show distances related to preferred usage.

DETAILED DESCRIPTION OF THE PREFERRED EMBODIMENTS

Refer first to FIG. 1, which illustrates a preferred version of the present invention mounted on an electronic component 10. The invention includes a heat-conducting plate 15 with a series of vane pairs 17a, 17b, 17c, 17d that depend from the edge of plate 15 and flare in alternating directions transverse to plate 15. This is illustrated with greater clarity in FIG. 2. The amount of angular displacement, designated $\alpha$, is preferably the same whether the vane is flared upward or downward. The vanes generate a vortex of air longitudinal to the direction of air flow (see FIG. 1), which disrupts the downstream wake as discussed above. The angle $\alpha$ is preferably between 10° and 45°, with 15° being especially preferred, although even a 90° angle will create a useful vortex; large angles are not preferred because they interfere unnecessarily with the air flow.

For illustrative convenience, the figures show each pair of vanes separated by a slot in plate 15. These slots are not necessary to proper operation. Instead, plate 15 can be stamped in a press to produce alternating vanes bridged by plate material that is stretched, but not torn, by the stamping operation.

Preferred spacing and attachment members are illustrated in FIG. 2. A spacing post 20 secures plate 15 to a base 22 which, in turn, mounts directly on the electronic component 10. This arrangement assures adequate clearance between the vanes and component 10. Beyond this requirement, however, the height of post 20 is not critical; indeed, to accommodate environments where circuit boards are stacked close to one another, the height of post 20 should be minimized. Plate 15, post 20 and base 22 are fabricated from a material, preferably metal, that conducts heat well.

The footprint of the plate 15 preferably matches that of the component to be cooled. This maximizes heat conduction and vortex formation without adding to the footprint space of the component. Also, because the largest impediment to heat conduction is the attachment between component 10 and base 22, the area of base 22 is preferably large; this affords a sizable attachment interface, facilitating heat dissipation. As illustrated in FIG. 3, the present invention can contain more than one plate to increase both heat conduction and vortex formation. In this case, the plates are preferably spaced apart so that the vanes of the different plates clear one another.

The orientation of the vanes with respect to an airflow is not critical. With a round plate, four pairs of vanes assures omnidirectionality, i.e., that a reasonably strong vortex will be generated regardless of the plate's orientation. A smaller number of vanes may require more careful placement with respect to the airflow. The shape of plate 15 is also not critical. As shown in FIG. 4, a plate 15' has a set of straight edges from which vanes 17a', 17b', 17c' and 17d' depend. For purposes of achieving omnidirectionality, it is preferred to locate a pair of vanes on each edge, as shown in the figure.

The profile of the present invention does not exceed that of most conventional heat sinks and, indeed, is significantly less than many. The present invention provides optimal cooling performance when located relatively close to a downstream component. In particular, the best performance occurs when the ratio of the distance between the centerlines of adjacent devices (parameter L in FIG. 5) to the diameter of the plate (parameter D in FIG. 5) is equal to or less than 1.7, and ideally equal to 1.5.

It will therefore be seen that I have designed a novel cooling device that facilitates removal of heat from electronic components with efficiency and in a manner that avoids adverse effect on downstream components. The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An omnidirectional, vortex-generating cooling member for board-mounted electronic components, the member comprising:
    a. at least one heat-conductive plate having an edge and at least two pairs of vanes that depend from the edge and flare in alternating directions transverse to the plate, said at least two pairs of vanes being evenly distributed about the edge of each plate such that a flow of air across a plate from any direction results in formation of a vortex in the direction of the flow;
    b. a post depending from said at least one plate; and
    c. means for mounting said post to an electronic component.

2. The cooling member of claim 1 wherein each flare results in an angle of 10 to 45 degrees.

3. The cooling member of claim 2 wherein the angle is 15 degrees.

4. The cooling member of claim 1 wherein said at least one plate has a footprint close to that of an electronic component to be cooled.

5. The cooling member of claim 1 wherein said at least one plate is substantially round.

6. The cooling member of claim 5 wherein said at least one plate contains at least three pairs of vanes.

7. The cooling member of claim 1 wherein said at least one plate has a plurality of straight edges, each of which contains a pair of vanes.

* * * * *